US011482833B2

(12) United States Patent
Onuma et al.

(10) Patent No.: US 11,482,833 B2
(45) Date of Patent: Oct. 25, 2022

(54) LIGHT EMITTING DEVICE

(71) Applicant: SHARP KABUSHIKI KAISHA, Sakai (JP)

(72) Inventors: Hiroaki Onuma, Sakai (JP); Toshio Hata, Sakai (JP); Yasuaki Hirano, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 393 days.

(21) Appl. No.: 16/789,270

(22) Filed: Feb. 12, 2020

(65) Prior Publication Data

US 2020/0274323 A1   Aug. 27, 2020

Related U.S. Application Data

(60) Provisional application No. 62/808,543, filed on Feb. 21, 2019.

(51) Int. Cl.
| | |
|---|---|
| *H01S 5/02* | (2006.01) |
| *H01S 5/06* | (2006.01) |
| *H01S 5/02208* | (2021.01) |
| *H01S 5/02253* | (2021.01) |
| *H01S 5/00* | (2006.01) |

(52) U.S. Cl.
CPC .............. *H01S 5/02* (2013.01); *H01S 5/0087* (2021.01); *H01S 5/02208* (2013.01); *H01S 5/02253* (2021.01); *H01S 5/0611* (2013.01)

(58) Field of Classification Search
CPC ...... H01S 5/02; H01S 5/0087; H01S 5/02208; H01S 5/02253; H01S 5/0611; H01S 5/02469; H01S 5/32341; H01S 5/4031; H01S 5/4087; H01S 5/02212
See application file for complete search history.

(56) References Cited

U.S. PATENT DOCUMENTS

| | | | | |
|---|---|---|---|---|
| 8,872,203 | B2* | 10/2014 | Nagahama | ............ H01S 5/0087 257/98 |
| 2006/0139926 | A1* | 6/2006 | Morioka | ........... G02F 1/133603 362/260 |

(Continued)

FOREIGN PATENT DOCUMENTS

| | | |
|---|---|---|
| JP | 2012-512508 A | 5/2012 |
| JP | 2013-089469 A | 5/2013 |

(Continued)

OTHER PUBLICATIONS

Machine English Translation of JP2013-120735A, Fujii et al. (Year: 2013).*

*Primary Examiner* — Rajarshi Chakraborty
*Assistant Examiner* — Glenn D Zimmerman
(74) *Attorney, Agent, or Firm* — ScienBiziP, P.C.

(57) ABSTRACT

A light emitting device includes a semiconductor light source device including a plurality of semiconductor light emitting elements, a wavelength conversion member that converts a wavelength of irradiation light from the semiconductor light source device, a concentrating lens that concentrates the irradiation light from the semiconductor light source device, and a cylindrical holder. The semiconductor light source device, the wavelength conversion member and the concentrating lens is supported by a support portion provided in an inner diameter portion of the cylindrical holder.

13 Claims, 8 Drawing Sheets

(56) References Cited

U.S. PATENT DOCUMENTS

| | | | |
|---|---|---|---|
| 2007/0019409 A1* | 1/2007 | Nawashiro | F21V 5/04 |
| | | | 257/E33.071 |
| 2012/0039072 A1 | 2/2012 | Lell et al. | |
| 2012/0313124 A1 | 12/2012 | Clatterbuck et al. | |
| 2014/0160782 A1* | 6/2014 | Harada | F21S 41/16 |
| | | | 362/297 |
| 2015/0109806 A1* | 4/2015 | Ahn | F21S 41/16 |
| | | | 362/510 |
| 2015/0372200 A1 | 12/2015 | Seko et al. | |
| 2016/0116123 A1 | 4/2016 | Yamanaka et al. | |
| 2016/0153633 A1* | 6/2016 | Shibata | F21S 41/321 |
| | | | 362/510 |
| 2017/0343859 A1 | 11/2017 | Chen | |
| 2017/0358716 A1* | 12/2017 | Park | H01L 33/60 |
| 2018/0235040 A1 | 8/2018 | Yamanaka et al. | |
| 2019/0027656 A1 | 1/2019 | Lee et al. | |
| 2020/0144460 A1 | 5/2020 | Onuma et al. | |

FOREIGN PATENT DOCUMENTS

| | | | |
|---|---|---|---|
| JP | 2013-120735 A | | 6/2013 |
| JP | 2013120735 A | * | 6/2013 |
| JP | 2014-520184 A | | 8/2014 |
| JP | 2016-009693 A | | 1/2016 |
| JP | 2018-22133 A | | 2/2018 |
| WO | 2015/011857 A1 | | 1/2015 |
| WO | 2017/068766 A1 | | 4/2017 |
| WO | 2017/154413 A1 | | 9/2017 |
| WO | 2019/009033 A1 | | 1/2019 |

* cited by examiner

LIGHT EMITTING DEVICE

BACKGROUND

1. Field

The present disclosure relates to a light emitting device including a semiconductor light source.

2. Description of the Related Art

In general, a light emitting device including a semiconductor light emitting element, a wavelength conversion member disposed in irradiation direction of the semiconductor light emitting element, and a concentrating lens that is disposed between the semiconductor light emitting element and the wavelength conversion member, and concentrates irradiation light from the semiconductor light emitting element is known (for example, refer to Japanese Unexamined Patent Application Publication No. 2016-9693 (published on Jan. 18, 2016)). In the light emitting device, the wavelength conversion member contains a phosphor that emits light after being excited by the irradiation light from the semiconductor light emitting element through the concentrating lens. The light emitting device is configured to emit a desired emission color by appropriately selecting a wavelength of the irradiation light of the semiconductor light emitting element, and the number and type of phosphors contained or laminated in the wavelength conversion member.

By the way, there is a demand for a high-output light emitting device that has a simple configuration and variable emission colors.

The present disclosure has been made in view of the above-described circumstances, a problem is to provide a high-output light emitting device that has a simple configuration and variable spectra of an emission light.

SUMMARY

An embodiment of the present disclosure provides a light emitting device including a semiconductor light source device including a plurality of semiconductor light emitting elements, a wavelength conversion member that converts a wavelength of irradiation light from the semiconductor light source device, a concentrating lens that is disposed between the semiconductor light source device and the wavelength conversion member, and concentrates the irradiation light from the semiconductor light source device; and a cylindrical holder, in which the semiconductor light source device, the wavelength conversion member, and the concentrating lens are supported by a support portion provided in an inner diameter portion of the cylindrical holder.

BRIEF DESCRIPTION OF THE DRAWINGS

FIG. 5A is a cross-sectional diagram and FIG. 5B is a top view diagram.

DESCRIPTION OF THE EMBODIMENTS

First Embodiment

Hereinafter, embodiments of the present disclosure will be described in detail.

Configuration of Light Emitting Device 100

Figure 1:
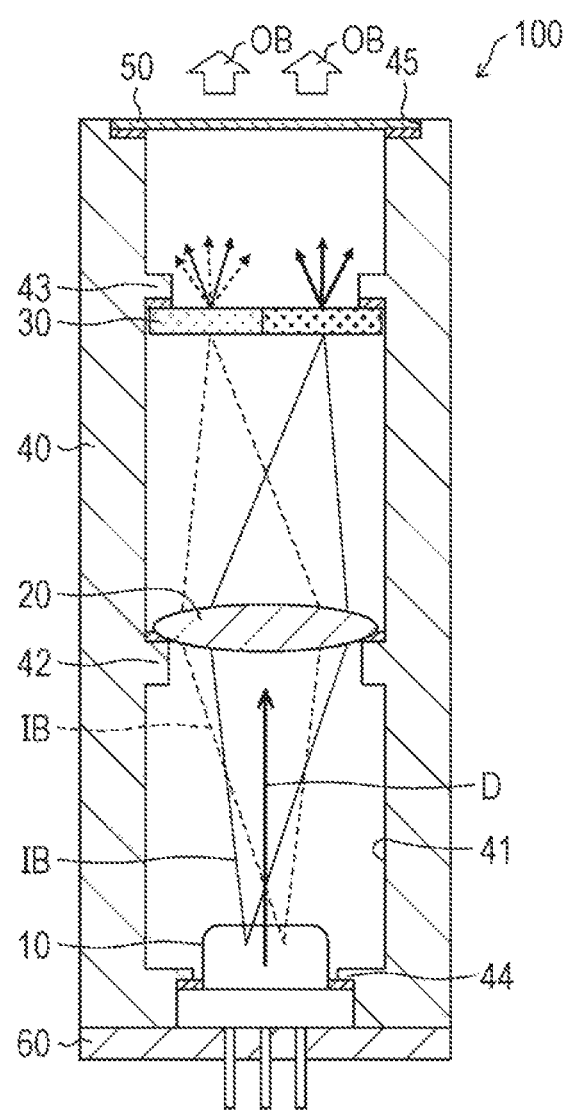
FIG. 1 is a cross-sectional diagram of a configuration of a light emitting device according to a first embodiment of the present disclosure.

FIG. 1 is a cross-sectional diagram of a configuration of a light emitting device 100 according to a first embodiment of the present disclosure. The light emitting device 100, for example, is a high output light emitting device that can be used for a peak output, such as indoor and outdoor lighting, vehicle-mounted headlamps, and projectors. As shown in FIG. 1, the light emitting device 100 includes a semiconductor light source device 10, a concentrating lens 20, and a wavelength conversion member 30. The semiconductor light source device 10, the concentrating lens 20, and the wavelength conversion member 30 are disposed on an inner diameter portion 41 of a cylindrical holder 40.

The semiconductor light source device 10 is a so-called TO-CAN package type light source device using a semiconductor light emitting element, in particular, a semiconductor laser (laser diode: LD) as a light source.

The concentrating lens 20 is an optical member that concentrates irradiation light IB from the semiconductor light source device 10. As the concentrating lens 20, a biconvex lens can be suitably used. The concentrating lens 20 is disposed between the semiconductor light source device 10 and the wavelength conversion member 30.

The wavelength conversion member 30 converts a wavelength of the irradiation light IB from the semiconductor light source device 10. The wavelength conversion member 30 is desirably provided at a focal position of the concentrating lens 20 where the light through the concentrating lens 20 is concentrated. The wavelength of the irradiation light IB from the semiconductor light source device 10 concentrated in the wavelength conversion member 30 through the concentrating lens 20 is converted through the wavelength conversion member 30 and travels toward an emission opening 45 of the holder 40.

Configuration of Holder 40

The holder 40 is formed of a material having a high thermal conductivity. A material that is lightweight, has the high thermal conductivity, and is easy to process, such as aluminum, can be suitably used for the holder 40. In addition, the holder 40 is not limited to aluminum, and may be formed of a metal or non-metal material having a thermal conductivity of 10 W/mK or more, more preferably 80 W/mK or more.

Support portions 42, 43, and 44 are provided on the inner diameter portion 41 of the holder 40 at the installation positions of the semiconductor light source device 10, the concentrating lens 20, and the wavelength conversion member 30. The support portions 42, 43, and 44 project from the inner diameter portion 41 of the holder 40 and are provided on the inner diameter portion 41 in a step shape. The support portions 42, 43, 44 may project in a ring shape along a circumferential direction of the inner diameter portion 41, or may partially project.

The support portion 42 is a step that supports the concentrating lens 20 and is referred to as a lens support portion 42. The concentrating lens 20 is bonded to the lens support portion 42 using an adhesive. The concentrating lens 20 is secured to a step surface of the lens support portion 42 on the side facing the emission opening in the holder 40. Although the illustration is omitted, the lens support portion 42 is configured with a pair of steps that projects from the inner diameter portion 41 and faces each other, and the concentrating lens 20 may be supported on the inner diameter portion 41 by pinching the concentrating lens 20 between the pair of steps.

The support portion 43 is a step that supports the wavelength conversion member 30 and is referred to as a wavelength conversion member support portion 43. The wavelength conversion member 30 is bonded to the wavelength conversion member support portion 43 using an adhesive. The wavelength conversion member 30 is secured to the step surface of the wavelength conversion member support portion 43 on the side facing the semiconductor light source device 10 in the holder 40. Thereby, even in a case where the wavelength conversion member 30 falls from the wavelength conversion member support portion 43, the wavelength conversion member 30 remains in luminous flux of the irradiation light IB from the semiconductor light source device 10. Therefore, since a laser light from the semiconductor light source device 10 is not directly emitted from the emission opening 45 without passing through the wavelength conversion member 30, safety can be improved.

Also, although the illustration is omitted, the wavelength conversion member support portion 43 is configured with a pair of steps that projects from the inner diameter portion 41 and faces each other, and may have a configuration that supports the wavelength conversion member 30 on the inner diameter portion 41 by pinching the wavelength conversion member 30 between the pair of steps.

A support portion 44 is a step that supports the semiconductor light source device 10 and is referred to as a light source support portion 44. The semiconductor light source device 10 is pinched and supported between the light source support portion 44 and a heat radiating plate 60 that closes the opening on the light source device side of the holder 40.

The heat radiating plate 60 (plate) is a plate-shaped member formed from a material having a high thermal conductivity. For the heat radiating plate 60, for example, aluminum that is lightweight and has a high thermal conductivity can be suitably used. In addition, the heat radiating plate 60 is not limited to aluminum, and may be formed of a metal or non-metal material having a thermal conductivity of 10 W/mK or more, more preferably 80 W/mK or more.

The semiconductor light source device 10 is mounted on the heat radiating plate 60 formed of a material having a high thermal conductivity. The heat radiation plate 60 functions as a heat sink for the semiconductor light source device 10 and absorbs heat from the semiconductor light source device 10. Moreover, the heat radiating plate 60 is in contact with the holder 40 formed of a material having a high thermal conductivity. In this way, the semiconductor light source device 10 is mounted on the heat radiating plate 60 formed of a material having a high thermal conductivity, and the heat radiating plate 60 is brought into contact with the holder 40 formed of a material having a high thermal conductivity. Accordingly, the heat from the semiconductor light source device 10 can be efficiently radiated from the heat radiating plate 60 and the holder 40. Accordingly, even in a case where the output of the semiconductor light source device 10 is increased, heat can be radiated efficiently, and performance and life of the semiconductor light source device 10 can be kept from being affected by heat. A heat radiating structure such as a fin may be appropriately provided on the outer periphery of the holder 40.

Procedure for Manufacturing Light Emitting Device 100

The procedure for assembling the light emitting device 100 can be, for example, as follows.

First, the semiconductor light source device 10 is mounted on the heat radiating plate 60. A stem 12 of the semiconductor light source device 10 and the heat radiating plate 60 may be welded or fused. Next, the wavelength conversion member 30 is secured to the wavelength conversion member support portion 43 of the holder 40 including the support portions 42, 43, and 44. Subsequently, the concentrating lens 20 is secured to the lens support portion 42 of the holder 40. Next, the holder 40 is mounted and secured on the heat radiating plate 60 on which the semiconductor light source device 10 is mounted.

Therefore, the light emitting device 100 includes the support portions 42, 43, 44 on the inner diameter portion 41 of the holder 40, and the concentrating lens 20, the wavelength conversion member 30, and the semiconductor light source device 10 are supported and secured to the support portions 42, 43, and 44, respectively. Thereby, at the time of assembling the light emitting device 100, the optical axis alignment of the concentrating lens 20, the wavelength conversion member 30, and the semiconductor light source device 10 can be easily performed, and the manufacturing work can be performed efficiently.

In the light emitting device 100 illustrated in FIG. 1, for example, a focal distance of the concentrating lens 20 is f=4.8 mm. The concentrating lens 20 and the wavelength conversion member 30 are arranged such that a distance between them is the focal length of the concentrating lens 20. Further, the concentrating lens 20 and the semiconductor light source device 10 are arranged such that a distance from a light emitting point of the light source to a major plane of the concentrating lens 20 is 5.8 mm.

In addition, the emission opening 45 of the holder 40 is closed by a light-transmitting member 50. A light-transmitting member support portion 46 having a step shape in which the inner diameter portion 41 is cut out along the circumferential direction is provided in the emission opening 45 of the holder 40. The light-transmitting member 50 is bonded and secured to a step surface of the light-transmitting member support portion 46 using an adhesive to close the emission opening 45. A securing method of the light-transmitting member 50 is not limited to the adhesive, and can be appropriately changed. In addition, since airtightness can be improved by selecting an appropriate fixing method, it is possible to greatly reduce an influence of an external environment on the light emitting device such as the wavelength conversion member 30 and the concentrating lens 20. Therefore, it can be used stably even under environment such as high temperature or presence of gas. As securing methods other than an adhesive, for example, there are a securing method with solder such as Sn—Ag—Cu after metalizing an outer circumferential portion of the light-transmitting member by metal vapor deposition or the like, and a method that a circular low melting point glass is inserted between the light-transmitting member 50 and the light-transmitting member support portion 46, and then the holder and the wavelength conversion member via the low melting point glass are secured by melting the low melting point glass by being treated in an appropriate temperature range between 300 to 1000° C.

The holder 40 is desirably configured as an integral type, and but may have a configuration that is divided in consideration of assembly workability.

Figure 2:
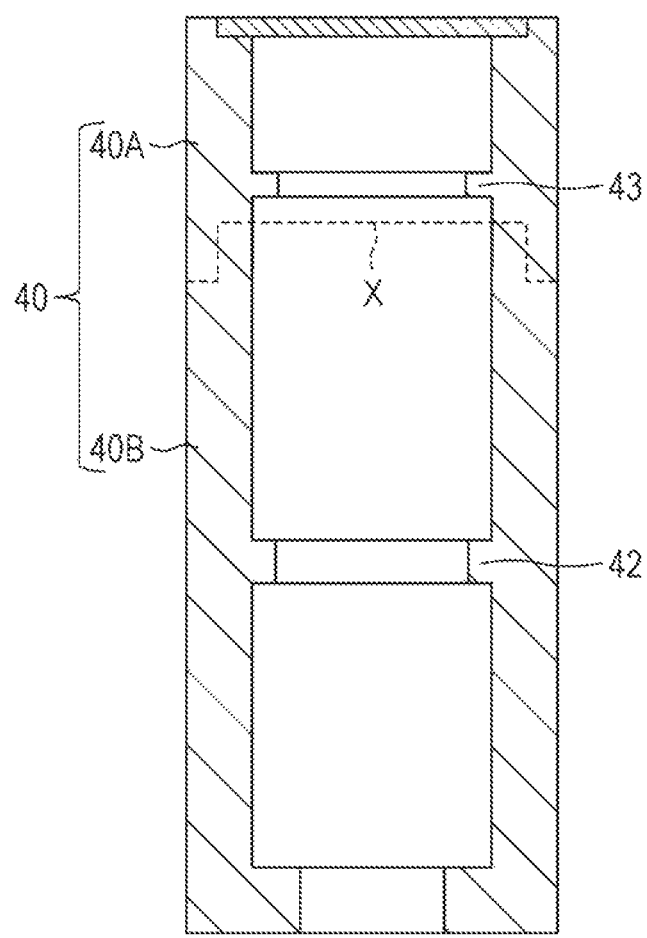
FIG. 2 is a cross-sectional diagram of a configuration of a holder.

As shown in FIG. 2, for example, the holder 40 may be divided into an upper holder 40A and a lower holder 40B in a random position between the wavelength conversion member support portion 43 and the lens support portion 42 as a dividing position X. In this way, the holder 40 is configured to be divided into the upper holder 40A and the lower holder 40B between the wavelength conversion member support portion 43 and the lens support portion 42. Thereby, workability of a work of respectively securing the wavelength conversion member 30 and the concentrating lens 20 to the wavelength conversion member support portion 43 and the lens support portion 42 can be improved.

Configuration of Semiconductor Light Source Device 10

Figure 3:
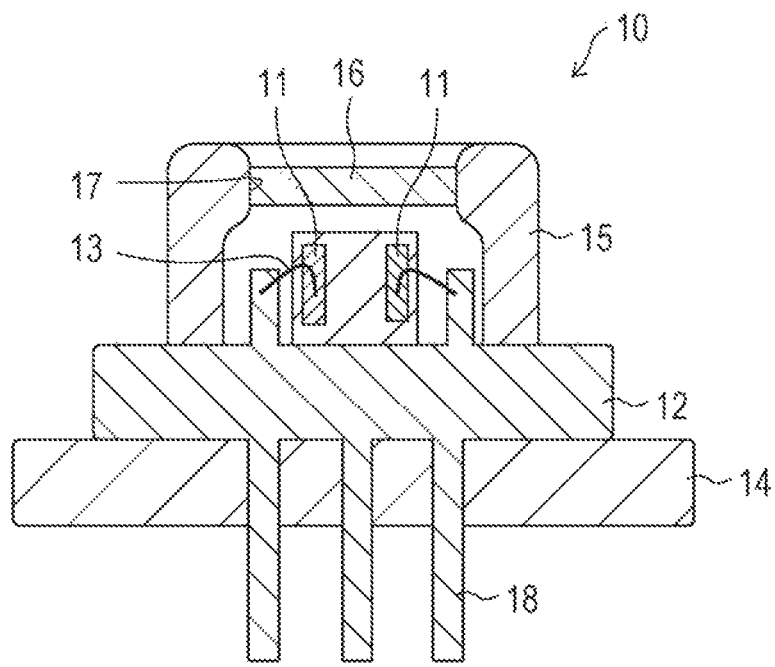
FIG. 3 is a schematic diagram of a configuration of a semiconductor light source device according to a first embodiment.

FIG. 3 is the diagram of the configuration of the semiconductor light source device 10. As shown in FIG. 3, the semiconductor light source device 10 includes a plurality of semiconductor laser chips 11 (semiconductor light emitting elements). The semiconductor laser chip 11 is a semiconductor laser chip that irradiates ultraviolet light or blue light having an emission peak wavelength in a range of 360 nm to 480 nm. The semiconductor light source device 10 is a TO-CAN package type laser light source device including at least two or more of the semiconductor laser chips 11. The semiconductor laser chip 11 of the first embodiment is a blue semiconductor laser chip that irradiates blue light, and the semiconductor laser chip 11 is referred to as a blue semiconductor laser chip 11.

The semiconductor light source device 10 includes a stem 12 mounted on an LD plate 14 that is a semiconductor light source substrate, and the blue semiconductor laser chip 11 is coupled to each of a plurality of wires 13 (leads) extending from the stem 12.

The semiconductor light source device 10 includes a can 15 that covers a periphery of the blue semiconductor laser chip 11 and has a metal cap shape. A light-transmitting plate 16 (cover glass) that transmits the irradiation light from the blue semiconductor laser chip 11 is provided in an irradiation opening 17 of the can 15. In addition, a pin 18 extending from the stem 12 extends through the LD plate 14. The blue semiconductor laser chip 11 emits light in a case where power supplied from the pin 18 to the wire 13 is applied.

The semiconductor light source device 10 is configured such that each of light outputs of the plurality of blue semiconductor laser chips 11 can be individually driven. Therefore, since the semiconductor light source device 10 includes the plurality of semiconductor laser chips, the light emitting device 100 can achieve high output. Moreover, the semiconductor light source device 10 can individually change each of the light outputs of the plurality of blue semiconductor laser chips 11 stepwise or continuously by changing a size of the power supplied to the blue semiconductor laser chip 11 via the wire 13 for each blue semiconductor laser chip 11.

Since the LD plate 14 is mounted on the heat radiating plate 60, the semiconductor light source device 10 transfers heat from the blue semiconductor laser chip 11 to the heat radiating plate 60, via the LD plate 14 (refer to FIG. 1). A hole through which the pin 18 extending from the stem 12 passes is formed in the heat radiating plate 60, and an external power is coupled to the pin 18 exposed via the hole.

Procedure for Manufacturing Semiconductor Light Source Device 10

The procedure for assembling the semiconductor light source device 10 can be, for example, as follows.

First, the stem 12 provided with a plurality of pins 18 is prepared. Next, each of the plurality of blue semiconductor laser chips 11 is secured to the stem 12 by die bonding. Subsequently, the wires 13 extending from anode and cathode pins 18 are coupled to each blue semiconductor laser chip 11 by wire bonding. Next, the can 15 is attached so as to cover the periphery of the blue semiconductor laser chip 11 and the wire 13.

Configuration of Wavelength Conversion Member 30

Figure 4:
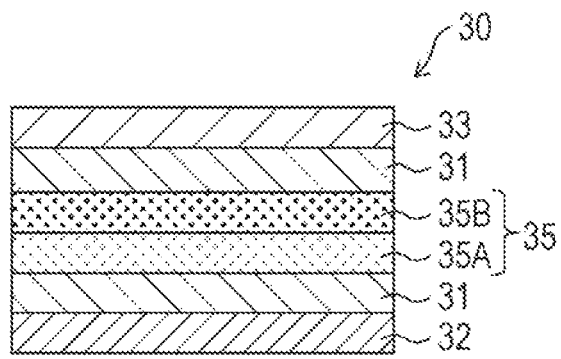
FIG. 4 is a cross-sectional diagram of an example of a wavelength conversion member according to a first embodiment.
Figure 5A:
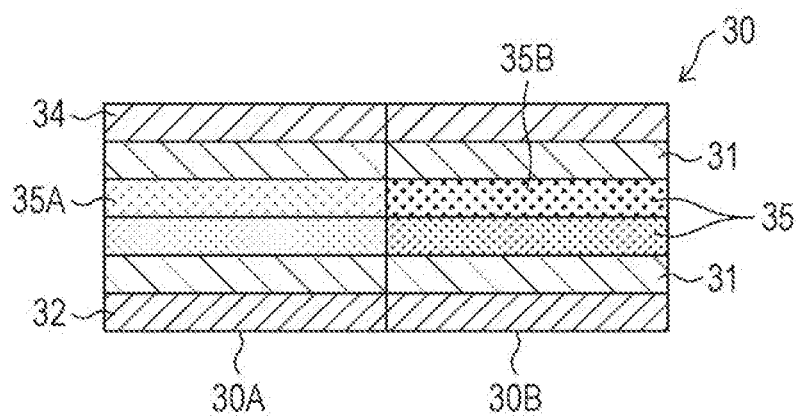
FIGS. 5A and 5B are diagrams of examples of a wavelength conversion member according to a first embodiment.
Figure 5B:
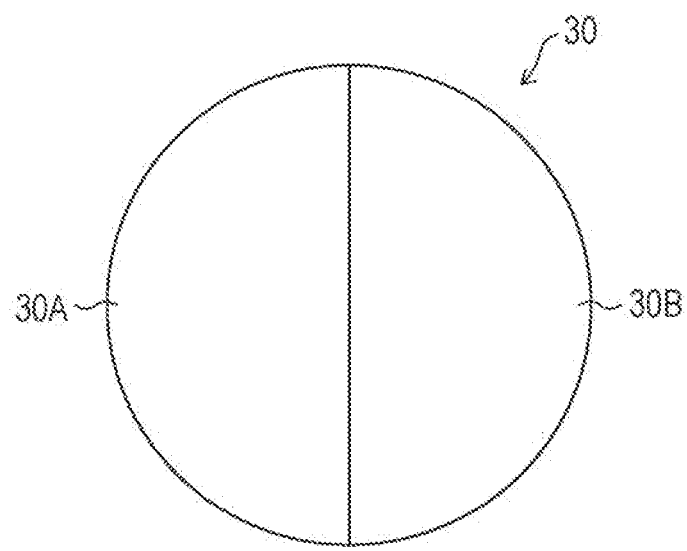

FIGS. 4 and 5 are diagrams of a configuration example of the wavelength conversion member 30. FIG. 4 is a cross-sectional diagram of an example of the wavelength conversion member 30, and FIG. 5A is a cross-sectional diagram of another example of the wavelength conversion member 30, and FIG. 5B is a top view diagram of the wavelength conversion member 30 shown in FIG. 5A viewed from the irradiation direction of the irradiation light from the semiconductor light source device 10.

As shown in FIG. 4, the wavelength conversion member 30 has a plurality of layers laminated in a cross-sectional view. In the first embodiment, the wavelength conversion member 30 is formed with a thickness of 2 mm and a diameter of 28.6 mm. The wavelength conversion member 30 is configured to be laminated with a glass layer 31, a wavelength selective layer 32, a phosphor layer 35, and an antireflection layer 33 formed from sapphire glass as a substrate, for example.

The wavelength conversion member 30 is a blue phosphor, a green phosphor, a yellow phosphor, or a red phosphor, and includes the phosphor layer 35 having at least one phosphor selected from Ce-activated $Ln_3(Al_{1-x}Ga_x)_5O_{12}$ (Ln is selected from at least one of Y, La, Gd, and Lu, and Ce substitutes for Ln), Eu, Ce-activated $Ca_3(Sc_xMg_{1-x})_2Si_3O_{12}$ (Ce substitutes for Ca), Eu-activated $(Sr_{1-x}Ca_x)AlSiN_3$ (Eu substitutes for Sr and Ca), Ce-activated $(La_{1-x}Y_x)_3Si_6N_{11}$ (Ce substitutes for La and Y), Ce-activated Ca-α-Sialon, Eu-activated β-Sialon, and Eu-activated $M_2Si_5N_8$ (M is selected from at least one of Ca, Sr, and Ba, and Eu substitutes for M).

The phosphor layer 35 is configured to include one or more types of phosphors. For example, a yellow phosphor layer 35A and a red phosphor layer 35B may be laminated. In addition, the phosphor layer 35 is pinched between the glass layers 31.

An antireflection layer 34 laminated on the glass layer 31 is formed on a light emission surface of the wavelength conversion member 30. The antireflection layer 34 blocks reflection of excitation light excited in the phosphor layer 35.

The wavelength selective layer 32 laminated on the glass layer 31 is formed on a light incident surface of the wavelength conversion member 30. The wavelength selective layer 32 is configured by a dichroic mirror and transmits only light in a blue wavelength range.

The wavelength conversion member 30 can emit only the light in the blue wavelength range, which is the irradiation light from the semiconductor light source device 10 and selected by the wavelength selective layer 32, by being excited in the phosphor layer 35. Since the phosphor layer 35 includes the yellow phosphor layer 35A and the red phosphor layer 35B, the phosphor layer 35 is excited by a laser light having the emission peak wavelength in a range of 360 nm to 480 nm, and emits a white light with high color rendering properties.

As shown in FIGS. 5A and 5B, the wavelength conversion member 30 is divided into a plurality of regions as seen from an emission direction. In the example shown in FIG. 5, the wavelength conversion member 30 is divided into two parts, a first region 30A and a second region 30B, at a position passing through a center. As shown in Figs, a particle size of each phosphor may be different. In the present embodiment, the first region 30A includes the phosphor layer 35 made of the yellow phosphor layer 35A having a phosphor multi-layer film structure including a film containing a yellow phosphor having a small particle diameter and a film containing a yellow phosphor having a large particle diameter. In addition, the second region 30B includes the phosphor layer 35 made of the red phosphor layer 35B having a phosphor multi-layer film structure including a film containing a red phosphor having a small particle diameter and a film containing a red phosphor having a large particle diameter.

The first region 30A and the second region 30B include the glass layer 31 respectively pinching the yellow phosphor layer 35A and the red phosphor layer 35B, the antireflection layer 33 provided on the light emission surface by being laminated on the glass layer 31, and the wavelength selective layer 32 provided on the light incident surface by being laminated on the glass layer 31.

Each region of the wavelength conversion member 30 has a configuration in which irradiation light from at least one of the plurality of blue semiconductor laser chips 11 is incident. The light emitting device 100 can change the light emission of the light excited by each region of the wavelength conversion member 30 by individually driving each light output of the plurality of blue semiconductor laser chips 11 included in the semiconductor light source device 10. Therefore, the emission color can be changed continuously from reddish light to bluish light. In this way, since the light emitting device 100 includes the plurality of blue semiconductor laser chips 11 and the wavelength conversion member 30 including a plurality of regions each including one or a plurality of types of phosphors, it is possible to provide the light emitting device having a high-output and variable emission colors with a simple configuration. A plurality of phosphors may be included in either or both of the phosphor layers of the first region 30A or the second region 30B, and light emitting efficiency and color rendering property can be improved by combining the phosphors. For example, in a case where it is desired to emit a white light, it is possible to improve the light emitting efficiency by using a blue light emitting semiconductor laser chip and a phosphor that emits a yellow light, and the color rendering property can be improved by using a combination of a blue light emitting semiconductor laser chip and a phosphor that emits a yellow light or a phosphor that emits a green light, or a phosphor that emits a red light.

Figure 6A:
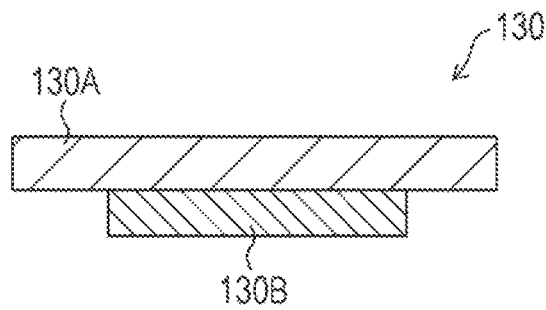
FIGS. 6A and 6B are cross-sectional diagrams of another example of a wavelength conversion member according to a first embodiment.
Figure 6B:
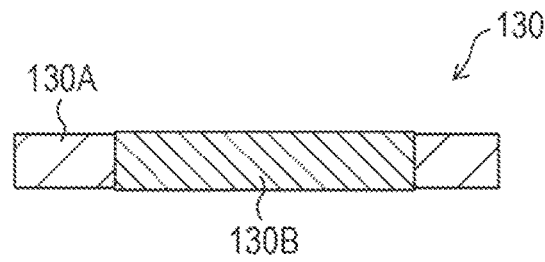

FIGS. 6A and 6B are diagrams showing configurations of modification examples of the wavelength conversion member 30. As shown in FIGS. 6A and 6B, the wavelength conversion member 130 is not limited to a configuration that is equally divided at a position passing through a center.

As shown in FIG. 6A, in the wavelength conversion member 130, a first region 130A and a second region 130B are formed with different diameter dimension, and the second region 130B having a smaller diameter dimension may be opposed to the semiconductor light source device 10, and may be laminated with the center positions aligned in the emission direction.

As shown in FIG. 6B, the wavelength conversion member 130 may be configured such that the first region 130A is provided on an outer periphery of the second region 130B, and the first region 130A and the second region 130B divide the diameter of the wavelength conversion member 130.

Second Embodiment

A second embodiment of the present disclosure is described below. For the sake of convenience of explanation, members having the same function as members described in the first embodiment are given the same reference sign, and thus description thereof will not be repeated. In addition, the configuration of the light emitting device 100 is the same as the configuration of the light emitting device 100 of the first embodiment described by using FIG. 1, and thus description thereof will not be repeated.

Figure 7:
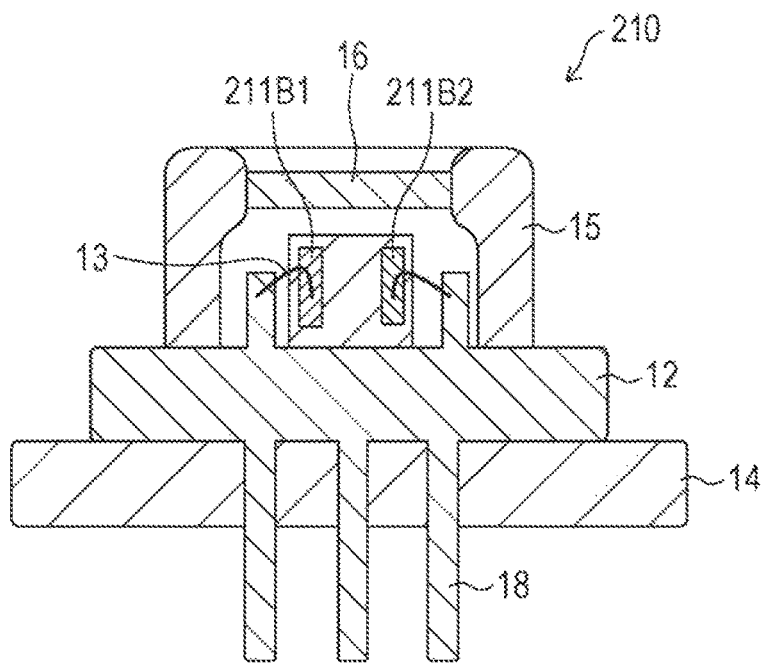
FIG. 7 is a schematic diagram of a configuration of a semiconductor light source device which is included in a light emitting device according to a second embodiment of the present disclosure.

FIG. 7 is a diagram of a configuration of a semiconductor light source device 210 which is included in the light emitting device 100 according to the second embodiment. As shown in FIG. 7, the semiconductor light source device 210 includes a plurality of semiconductor laser chips 211B1 and 211B2 (semiconductor light emitting elements). The semiconductor laser chips 211B1 and 211B2 are the semiconductor laser chip that irradiates ultraviolet light or blue light having an emission peak wavelength in a range of 360 nm to 480 nm, and is referred to as a blue semiconductor laser chips 211B1 and 211B2.

The semiconductor light source device 210 can individually drive each light output of the semiconductor laser chips 211B1 and 211B2.

Figure 8:
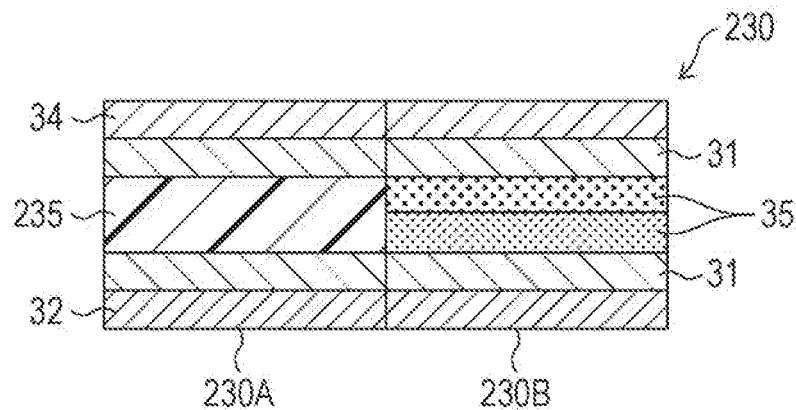
FIG. 8 is a cross-sectional diagram of an example of a wavelength conversion member which is included in a light emitting device according to a second embodiment.

FIG. 8 is a diagram of a configuration of a wavelength conversion member 230 which is included in the light emitting device 100 according to the second embodiment. As shown in FIG. 8, the wavelength conversion member 230 is divided into a plurality of regions as seen from an emission direction. In the example shown in FIG. 8, the wavelength conversion member 230 is equally divided into two parts, a first region 230A and a second region 230B, at a position passing through a center. The wavelength conversion member 230 may have a configuration in which the first region 230A and the second region 230B are laminated in the emission direction, or may have a configuration in which the diameter is divided (refer to FIGS. 6A and 6B).

The first region 230A is a light-transmitting region, and is a region where irradiation light from either the blue semiconductor laser chip 211B1 or the blue semiconductor laser chip 211B2 is incident. The first region 230A includes a light diffusing agent-containing resin layer 235 made of a light-transmitting member, which is pinched between the glass layers 31. A diffused light that is the irradiation light from either the blue semiconductor laser chip 211B1 or the blue semiconductor laser chip 211B2, and is diffused through the light diffusing agent-containing resin layer 235 without being color-converted is wavelength-converted is emitted from the wavelength conversion member 230. The first region 230A desirably has a light scattering function from the viewpoint of eye-safeness, and but does not have to have the light scattering function.

The second region 230B is a region where the irradiation light from either the blue semiconductor laser chip 211B1 or the blue semiconductor laser chip 211B2 is incident, and includes the phosphor layer 35 pinched between the glass layers 31. The phosphor layer 35 has a phosphor multi-layer film structure including a film containing a phosphor having a small particle diameter and a film containing a phosphor having a large particle diameter. The phosphor layer 35 includes, for example, a yellow phosphor that is excited by the irradiation light from either the blue semiconductor laser chip 211B1 or the blue semiconductor laser chip 211B2. The phosphor layer 35 is not limited to the yellow phosphor, and but may also contain one or more types of phosphors that is excited by the irradiation light from either the blue semiconductor laser chip 211B1 or the blue semiconductor laser chip 211B2 of the blue phosphor, the red phosphor, or the green phosphor, or the like. The irradiation light from either the blue semiconductor laser chip 211B1 or the blue semiconductor laser chip 211B2 is color-converted by passing through the phosphor layer 35.

In this way, in the light emitting device 100 according to the second embodiment, the semiconductor light source device 210 includes the plurality of blue semiconductor laser chips 211B1 and 211B2. In addition, the light emitting device 100 includes the wavelength conversion member 230 having a plurality of regions where light from each laser is incident. Furthermore, the semiconductor light source device 210 can individually drive each light output from the plurality of lasers. Accordingly, for example, in a case where the yellow phosphor is used for the phosphor layer 35 of the wavelength conversion member 230, the light emitting device 100 changes the output of the irradiation light from the plurality of blue semiconductor laser chips 211B1 and 211B2, and thereby a color of the emission light can be continuously changed from the blue light to the white light. Thus, depending on type of phosphor used for the phosphor layer 35, it is possible to continuously change the light emitted from the semiconductor light source device 210 from blue to phosphor emission color in accordance with an output balance of the irradiation light from the plurality of blue semiconductor laser chips 211B1 and 211B2.

Third Embodiment

A third embodiment of the present disclosure is described below. For the sake of convenience of explanation, members having the same function as members described in the first embodiment are given the same reference sign, and thus description thereof will not be repeated. In addition, the configuration of the light emitting device 100 is the same as the configuration of the light emitting device 100 of the first embodiment described by using FIG. 1, and thus description thereof will not be repeated.

Figure 9:
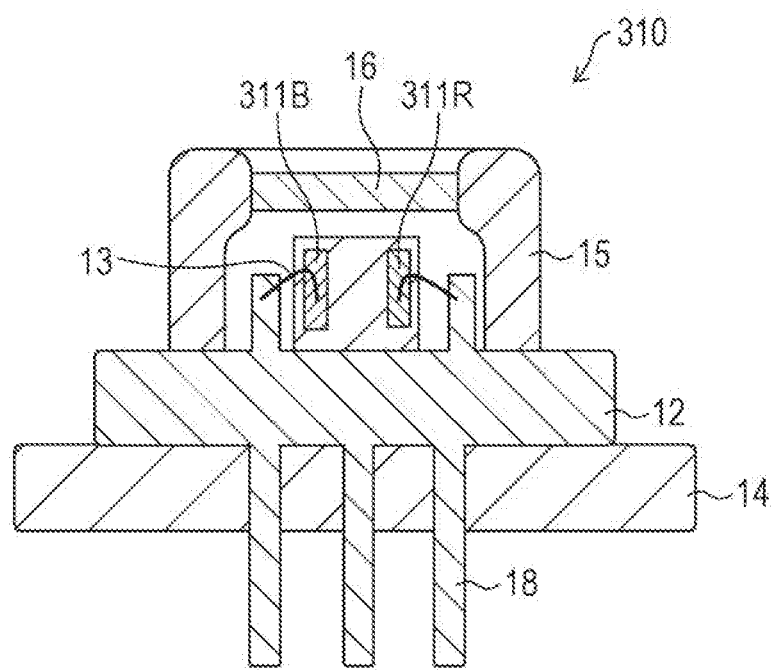
FIG. 9 is a schematic diagram of a configuration of a semiconductor light source device which is included in a light emitting device according to a third embodiment and a fourth embodiment of the present disclosure.

FIG. 9 is a diagram of a configuration of a semiconductor light source device 310 which is included in the light emitting device 100 according to the third embodiment. As shown in FIG. 9, the semiconductor light source device 310 includes a plurality of semiconductor laser chips 311B and 311R (semiconductor light emitting elements). The semiconductor laser chip 311B is a semiconductor laser chip that irradiates ultraviolet light or blue light having the emission peak wavelength in a range of 360 nm to 480 nm, and is referred to as a blue semiconductor laser chip 311B. A semiconductor laser chip 311R is an infrared semiconductor laser or a red semiconductor laser, and is referred to as a red/infrared semiconductor laser chip 311R.

In the third embodiment, the semiconductor light source device 310 includes at least one ultraviolet or blue semiconductor laser element having the emission peak wavelength in a range of 360 nm to 480 nm and at least one red/infrared semiconductor laser having an emission peak wavelength in a range of 600 nm to 800 nm, desirably in a range of 620 nm to 660 nm. The semiconductor light source device 310 can individually drive each light output from the plurality of lasers.

Light from the blue semiconductor laser chip 311B is color-converted by passing through the second region 230B of the wavelength conversion member 230 shown in FIG. 8. The light from the red/infrared semiconductor laser chip 311R is emitted by passing through the first region 230A of the wavelength conversion member 230 without being color-converted. The first region 230A desirably has a light scattering function from the viewpoint of eye-safeness, and but does not have to have the light scattering function.

In this way, in the light emitting device 100 of the third embodiment, the semiconductor light source device 310 includes the plurality of semiconductor laser chips 311B and 311R having different emission peak wavelengths. Thereby, the light emitting device 100 can continuously change the color of the emission light from reddish light to white light by changing the output of the irradiation light from each of the semiconductor laser chips 311B and 311R.

Figure 10:
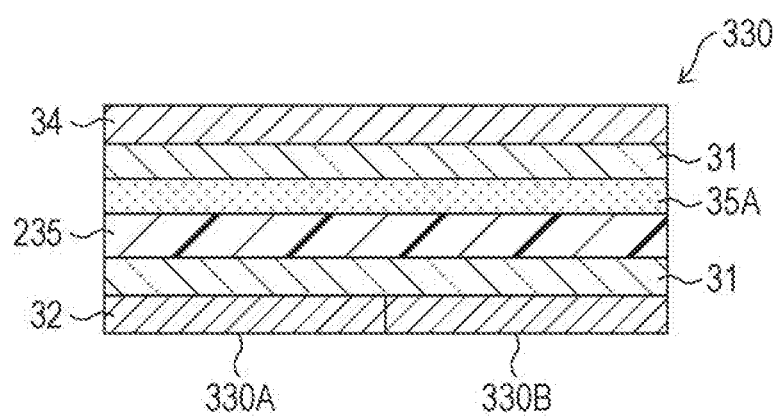
FIG. 10 is a cross-sectional diagram of another example of a wavelength conversion member which is included in a light emitting device according to a third embodiment.

FIG. 10 is a cross-sectional diagram of a configuration of a modification example of a wavelength conversion member 330 which is included in the light emitting device 100 according to the third embodiment. As shown in FIG. 10, the wavelength conversion member 330 includes a region in which the phosphor layer 35 and the light diffusing agent-containing resin layer 235 are pinched between the glass layers 31 and laminated in the emission direction. In addition, although the wavelength conversion member 330 showed an example provided with the yellow phosphor layer 35A as the phosphor layer 35, it is not limited to the yellow phosphor layer 35A, and a phosphor layer containing the red phosphor, the green phosphor, the blue phosphor, or the like may be used.

In the wavelength conversion member 330, only the wavelength selective layer 32 is divided into a first region 330A and a second region 330B. The first region 330A is a region where irradiation light from the red/infrared semiconductor laser chip 311R is incident, and transmits light in a wavelength range of infrared light or red light. The first region 330A is configured with a dichroic mirror. The second region 330B is a region where the irradiation light from the blue semiconductor laser chip 311B is incident, and transmits the ultraviolet light or the blue light having the emission peak wavelength in a range of 360 nm to 480 nm. Each of the first region 330A and the second region 330B is configured with an individual dichroic mirror.

Thus, the wavelength conversion member 330 may be divided into a plurality of regions where the wavelength selective layer 32 transmits light in different wavelength ranges. In this way, by individually driving the light outputs from the plurality of lasers having different wavelength ranges, it is possible to provide the light emitting device having a high-output and variable colors.

Fourth Embodiment

A fourth embodiment of the present disclosure is described below. For the sake of convenience of explanation, members having the same function as members described in the first embodiment and the third embodiment are given the same reference sign, and the description thereof will not be repeated. In addition, the configuration of the light emitting device 100 is the same as the configuration of the light emitting device 100 of the first embodiment described by using FIG. 1, and thus description thereof will not be repeated.

The semiconductor light source device 310 included in the light emitting device 100 according to the fourth embodiment is the same as the semiconductor light source device 310 according to the third embodiment described in FIG. 9 except that the red/infrared semiconductor laser chip 311R has an emission peak wavelength from 800 nm to 1600 nm.

In the light emitting device 100 according to the fourth embodiment, the light from the blue semiconductor laser chip 311B of the semiconductor light source device 310 is color-converted by passing through the second region 230B of the wavelength conversion member 230 shown in FIG. 8. The light from the red/infrared semiconductor laser chip 311R is diffused and emitted by passing through the first region 230A of the wavelength conversion member 230 without being color-converted by the light diffusing agent-containing resin layer 235.

Moreover, by emitting the red/infrared semiconductor laser chip 311R, it is possible to emit high output distance-measuring light having the emission peak wavelength in the range of 800 nm to 1600 nm. Thereby, it is possible to emit the distance-measuring light having a wavelength that is effective for distance measurement and that is not absorbed by a phosphor plate.

In addition, since both the blue semiconductor laser chip and the red/infrared semiconductor laser chip are included, the infrared light is irradiated, and light is received by an infrared light sensor provided separately by controlling the driving of the light source in accordance with a positional relationship with an irradiated object in a configuration for emitting the distance-measuring light. Accordingly, it can also be used to detect whether there is a subject in front of the light source. Then, in a case where the irradiated infrared light is blocked, control such as reducing intensity of the white light or turning it off may be performed. Or according to the situation where the disclosure is used, it is also possible to be switched and used for an illumination use and an auxiliary light source use for an infrared ray camera.

Thereby, the light emitting device 100 according to the fourth embodiment can simultaneously perform both emission of visible light and emission of the distance-measuring light.

Modification Example of Wavelength Conversion Member

The wavelength conversion member is not limited to the structure of the wavelength conversion members 30, 130, 230, and 330 described above, and may have the following structure.

The wavelength conversion member may be a plate-shaped member made of only a phosphor, and for example,
 a member that single crystal phosphor is cut into a plate-shape,
 a member that phosphor particles are compression-molded into a plate shape,
 a member that is compression-formed by mixing the phosphor particles and light scattering particles, and
 a member that the phosphor particles are coated and formed in a layer-shape on a transparent substrate formed from sapphire, glass, or the like, using an organic binder or inorganic binder can be used. In addition, the phosphor layer in the wavelength conversion member and the wavelength conversion member having the simple structure described above may have voids depending on the formation method thereof. Therefore, a light scattering is affected, and the light scattering increases as the amount of voids increases. Further, the wavelength conversion member may be the structure of 30, 130, 230, 330 or a combination of a plurality of the above structures.

Figure 11A:
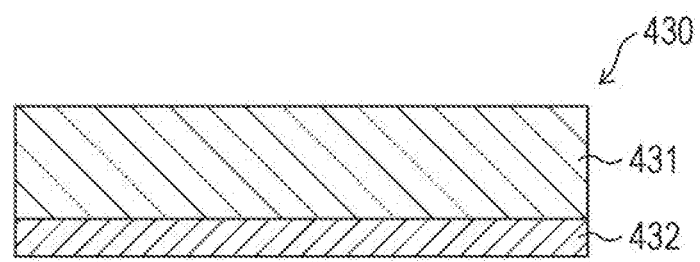
FIGS. 11A and 11B are diagrams of modification examples of wavelength conversion members.
Figure 11B:
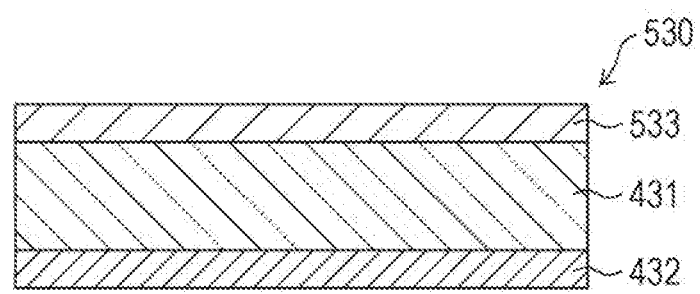

FIGS. 11A and 11B are diagrams of configurations of wavelength conversion members 430 and 530 which are modification examples.

As shown in FIG. 11A, the wavelength conversion member 430 may be formed a wavelength selective light-reflecting region 432 having such a characteristic that reflects a phosphor light, on an incident side of light from a laser of a plate-shaped member 431 made of only the phosphor described above. The light-reflecting region 432 can be configured with the dichroic mirror.

Furthermore, as shown in FIG. 11B, the wavelength conversion member 530 may also form the dichroic mirror or a wavelength selective light-absorbing color filter layer 533, which have characteristics that reflect light from a laser of either the plate-shaped member (phosphor plate) 431 made of only the phosphor or a member (431+432) in which the light-reflecting region 432 is formed on the plate-shaped member 431 made of only the phosphor, on the light emission side from the laser. A design of reflectivity of the dichroic mirror or transmitting spectral characteristic of the color filter is appropriately changed in accordance with a desired characteristic of the spectra of the light emitted from the semiconductor light source device.

In addition, as in the wavelength conversion members 30, 130, 230, and 330 described above, different wavelength conversion members may be combined in a case of seeing in the cross-sectional direction, and thereby in a case where a plurality of semiconductor laser chips are used, different emission spectra can be obtained according to the output of each semiconductor laser chip by being incident on different wavelength conversion members for each semiconductor laser chip.

The wavelength conversion member may be a member that forms have the light scattering layer on the incident side of the light from the laser, or on both the incident side and the emission side of the light from the laser of the plate-shaped member made of only the phosphor.

In addition, in order to suppress in-plane guided in the plate-shaped member made of only the phosphor, the wavelength conversion member may have a configuration which includes a reflection film or a reflective layer formed by a metal film or a dichroic mirror on both sides of the phosphor plate. In this way, light extraction efficiency from the emission surface of the wavelength conversion member can be improved by providing the reflection film or the reflective layer on both sides of the phosphor plate.

The present disclosure contains subject matter related to that disclosed in U.S. Provisional Patent Application No. 62/808,543 filed in the US Patent Office on Feb. 21, 2019, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:
a semiconductor light source device including a plurality of semiconductor light emitting elements;
a wavelength conversion member that converts a wavelength of irradiation light from the semiconductor light source device;
a concentrating lens that is disposed between the semiconductor light source device and the wavelength conversion member, and concentrates the irradiation light from the semiconductor light source device; and
a cylindrical holder,
wherein each of the semiconductor light source device, the wavelength conversion member, and the concentrating lens is supported by the corresponding support portion provided in an inner diameter portion of the cylindrical holder,
the holder is divided into an upper holder and a lower holder in a random position between the support portion supporting the wavelength conversion member and the support portion supporting the concentrating lens, and
the wavelength conversion member is provided on a lower surface of the support portion supporting the wavelength conversion member.

2. The light emitting device according to claim 1, wherein the wavelength conversion member is divided into a plurality of regions as seen from an emission direction, and each region contains one or more phosphors.

3. The light emitting device according to claim 1, wherein the wavelength conversion member has a plurality of layers laminated in a cross-sectional view.

4. The light emitting device according to claim 1, wherein the wavelength conversion member has a light-transmitting region.

5. The light emitting device according to claim 1, wherein the wavelength conversion member has a wavelength selective light-reflecting region.

6. The light emitting device according to claim 1, wherein the wavelength conversion member has a wavelength-selective light-absorbing region.

7. The light emitting device according to claim 1, wherein the semiconductor light source device individually drives each of light outputs of the plurality of semiconductor light emitting elements.

8. The light emitting device according to claim 1, wherein the semiconductor light source device is mounted on a plate formed from a member having a high thermal conductivity.

9. The light emitting device according to claim 8, wherein the holder is formed from a member having a high thermal conductivity and is in contact with the plate.

10. The light emitting device according to claim 9, further comprising:
a light-transmitting member that closes an emission opening of the holder.

11. The light emitting device according to claim 1, wherein at least one of the plurality of semiconductor light emitting elements is an ultraviolet or blue semiconductor laser element having an emission peak wavelength in a range of 360 nm to 480 nm.

12. The light emitting device according to claim 1, wherein the plurality of semiconductor light emitting elements includes an infrared semiconductor laser or a red semiconductor laser.

13. The light emitting device according to claim 1, wherein the wavelength conversion member is a blue phosphor, a green phosphor, a yellow phosphor, or a red phosphor, and includes at least one phosphor selected from Ce-activated $Ln_3(Al_{1-x}GA_x)_5O_{12}$, wherein Ln is selected from at least one of Y, La, Gd, and Lu, and Ce substitutes for Ln, Eu, Ce-activated $Ca_3(Sc_xMg_{1-x})_2Si_3O_{12}$, wherein Ce substitutes for Ca, Eu-activated $(Sr_{1-x}Ca_x)AlSiN_3$, wherein Eu substitutes for Sr and Ca, Ce-activated $(La_{1-x}Y_x)_3Si_6N_{11}$, wherein Ce substitutes for La and Y, Ce-activated Ca-α-Sialon, Eu-activated β-Sialon, and Eu-activated $M_2Si_5N_8$, wherein M is selected from at least one of Ca, Sr, and Ba, and Eu substitutes for M, x represents a rate of a number of each element assuming that a total number of elements is 1, and $0<x<1$.

* * * * *